United States Patent

Nakajima et al.

[11] Patent Number: 5,804,983
[45] Date of Patent: Sep. 8, 1998

[54] PROBE APPARATUS WITH TILT CORRECTION MECHANISMS

[75] Inventors: Hisashi Nakajima; Haruhiko Yoshioka, both of Yamanashi-ken, Japan

[73] Assignees: Tokyo Electron Limited, Tokyo; Tokyo Electron Yamanashi Limited, Nirasaki, both of Japan

[21] Appl. No.: 824,970

[22] Filed: Mar. 27, 1997

Related U.S. Application Data

[62] Division of Ser. No. 361,537, Dec. 22, 1994, Pat. No. 5,642,056.

[30] Foreign Application Priority Data

Dec. 22, 1993 [JP] Japan ................................ 5-322953
Jul. 28, 1994 [JP] Japan ................................ 6-176603

[51] Int. Cl.[6] ................................................ G01R 31/02
[52] U.S. Cl. ...................................... 324/758; 324/754
[58] Field of Search ............................. 324/758, 754–757, 324/765

[56] References Cited

U.S. PATENT DOCUMENTS

| | | | |
|---|---|---|---|
| 4,677,474 | 6/1987 | Sato et al. | 348/87 |
| 4,751,457 | 6/1988 | Veenendaal | 324/758 |
| 4,786,867 | 11/1988 | Yamatsu | 324/758 |
| 4,864,227 | 9/1989 | Sato | 324/758 |
| 4,929,893 | 5/1990 | Sato et al. | 324/758 |
| 4,934,064 | 6/1990 | Yamaguchi et al. | 33/645 |
| 4,943,767 | 7/1990 | Yokota | 324/758 |
| 5,065,092 | 11/1991 | Sigler | 324/758 |
| 5,091,692 | 2/1992 | Ohno et al. | 324/758 |
| 5,172,053 | 12/1992 | Itoyama | 324/758 |
| 5,394,100 | 2/1995 | Bohler et al. | 324/758 |
| 5,410,259 | 4/1995 | Fujihara et al. | 324/758 |
| 5,422,579 | 6/1995 | Yamaguchi | 324/758 |
| 5,440,943 | 8/1995 | Holt et al. | 74/89.15 |
| 5,510,723 | 4/1996 | Canella et al. | 324/758 |

*Primary Examiner*—Ernest F. Karlsen
*Assistant Examiner*—Russell M. Kobert
*Attorney, Agent, or Firm*—Oblon, Spivak, McClelland, Maier & Neustadt, P.C.

[57] ABSTRACT

A probe apparatus comprising a table on which a semiconductor wafer is mounted, the wafer having a circuit connected to a plurality of pads, a probe card assembly positioned relative to a reference plane, and having a card body and groups of probes held by a card holder, a drive system for moving the table up and down to cause the pads to be contacted with probe tips, a test head for sending test signal to the circuit through probes and pads, which are contacted with one another, to test the electric property of the circuit, a sensor for detecting the probe tip profile or levels at plural points of the probe card assembly, a controller for calculating the tilting degree and direction of probe tip profile of probe groups on the basis of results thus detected to thereby send correction commands, and a tilt correction unit for supporting the card holder and adjusting a level of the card holder at the plural points, responsive to the command applied from the controller, to thereby make the probe tip profile of each probe group parallel to the reference plane.

6 Claims, 9 Drawing Sheets

PROBE APPARATUS WITH TILT CORRECTION MECHANISMS

This is a division of application Ser. No. 08/361,537 filed on Dec. 22, 1994, now U.S. Pat. No. 5,642,056.

BACKGROUND OF THE INVENTION

1. Field of the Invention

The present invention relates to a probe apparatus for checking the electric property of an object such as a semiconductor wafer chip.

2. Description of the Related Art

In the conventional probe apparatus disclosed in Jpn. Pat. Appln. KOKAI Publication No. Sho 64-73632, a probe card is positioned in an apparatus body through a card holder and a test head is arranged above it.

The probe card mainly used is of the probe-tilted type in which each probe as tilted relative to a printed plate. The other probe card different from the probe-tilted one as of the vertical probe type in which a plurality of probes extend vertical from the probe card at high density. This vertical type probe card (VTPC) has been made to meet -he number of electrode pads increased and their pitch made finer as semiconductor chips are more and more integrated.

In the conventional probe apparatus, the wafer-mounted table (or wafer stage), a head plate and an insert ring are arranged parallel to one another. However, the tip level of probes becomes uneven because of attaching errors of the head plate, the insert ring and a card holder or because of making errors and deformation of the probe card itself. As the result, level of probe tip portions are differ, and the probe tip profile is tilted or shifted from its predetermined position relative to a horizontal plane.

"The probe tip profile" corresponds to a plane or a curved surface formed by an envelope extending along tips of probes.

In the case of a probe card on which the probe tip profile of each probe group is tilted or shifted. One tips of probe line or group are put in a high level position while the other tips of probe line or group are in a low position. When this tilting of probe tips of one group from those of the other group exceeds an allowable value (smaller than 20–30 $\mu$m), some of the probes do not contact or incompletely contact with the pads to thereby cause full electric continuity not to be attained even if the wafer on the wafer-mounted table is over-driven or lifted over their contact point.

In recent years, the number of probes is increased in the probe apparatus now used. It is therefore quite important that the accuracy of probe tips of the probe card is high. The tilting or shifting of the probe tip profile becomes more and more of a serious problem accordingly. In the conventional probe apparatus, a microscope is set to the apparatus body, the wafer-mounted table (or wafer chuck) is lifted until the wafer is contacted with contact pins, and probe tips of each probe group contact with the wafer or their tracks on the wafer are checked through the microscope. When the probe tip profile of each probe group is tilted or shifted from their predetermined position, the probe card is re-set In the apparatus body or fasteners for the head plate are unfastened and a spacer is inserted between the head plate and its reference plane.

However, it is quite difficult to check the tilting of the probe tip level through the microscope. In addition, it is also quite difficult to find the location to insert the spacer under the head plate. Further, the probe card is not manufactured to meet the condition under which it encounters in the probe apparatus. Every probe card, therefore, can become deformed. When a heavy test head is arranged above the probe card practically set, another tilting of the probe tip profile is caused and it is quite troublesome to correct it.

SUMMARY OF THE INVENTION

The object of the present invention is therefore to provide a probe apparatus capable of more easily detecting the tilting of the probe tip profile of each probe group, which is caused by making and attaching errors and deformation of the probe card, under such a condition that the probe card is practically set in the apparatus, and also capable of by far more easily and reliably correcting this tilting of the probe tip profile.

According to the present invention, there can be provided a probe apparatus comprising a table on which an object to be tested is mounted, the object having a circuit connected to a plurality of pads; a probe card assembly positioned relative to a reference plane, and having a card body and groups of probes held on a card holder; lifter means for moving the object-mounted table up and down to cause the pads of the object to be contacted with probe tips of probe groups; a test head for applying test signal to the circuit of the object through the probes and pads, which are contacted with one another, to test the electric property of the circuit; detector means for detecting probe tip profiles or levels at plural points of the probe card assembly; correction command means for calculating a tilting degree and direction of each probe group from results thus detected to send correction commands; and tilt correction means for supporting the card holder and adjusting each of levels of the card holder at the plural points, responsive to commands applied from the correction command means, to make the probe tip profiles of each probe group parallel to the reference plane.

The probe tip profile detector means includes a displacement sensor of the contact type set on the table on which the object to be tested is also mounted and has plural individual detection areas which are contacted with probes of the probe card when the table is lifted, and a detector circuit for detecting changes in voltage caused when each detection area of the contact type displacement sensor is contacted with probes. It is therefore desirable that the probe tip profile of each probe group is detected responsive to signal applied from the detector circuit and on the basis of a distance over which the table is lifted.

It as preferable that the probe tip profile detector means includes a camera through which the image of probe tip profile of probes is taken at plural sections, and a detector circuit for detecting the probe tip profile of probes at plural sections from focus depths of the camera.

The probe tip profile detector means may include a conductive dummy plate mounted on the table, and a contact-check-programmed tester for checking whether or not probes are contacted with the dummy plate. When arranged as described above, the probe tip level of probes can be detected at plural sections, responsive to signals applied from the tester and on the basis of a distance over which the table is lifted.

It is desirable that the card holder, insert ring or head plate is supported at least at three points thereof by the tilt correction unit. It is also desirable that the tilt correction unit has a ball hinge mechanism arranged at least one of the three points to support the card holder and others, and level adjustment screw mechanisms arranged at least at the other two points to adjust levels of the card holder and others.

Each level adjustment screw mechanism may include a manual adjustment screw having a graduated dial or a ball screw provided with an autodrive motor.

In order to carry out the probe test with a higher accuracy, it is needed that the test head and the object to be tested are kept parallel to each other. There may be provided test head adjustment mechanisms for supporting the test head from the apparatus body to adjust the tilting of it, probe tip measuring means for measuring the parallel of probes relative to the horizontal reference plane of the object-mounted table, and control means for controlling the test head adjustment mechanisms responsive to detection signals applied from the probe tip measuring means to adjust the tilting of the test head and keep probe tips parallel to the reference plane.

It is desirable that each test head adjustment mechanism includes a motor arranged in the apparatus body, a crew rod rotated by the motor, and a slider member screwed onto the screw rod and moved up and down, as the screw rod is rotated, while supporting the test head.

Further, test head adjustment mechanisms capable of supporting the test head from the apparatus body and adjusting the tilting of the test head may be provided as means for keeping the test head and the object parallel to each other. It is desirable in this case to provide probe tip measuring means for measuring the parallel (or tilt) of probes relative to the reference plane, object measuring means for measuring the parallel of the object mounted on the object-mounted table, and control means for controlling the test head adjustment mechanisms responsive to detection signals applied from the probe tip and object measuring means to adjust the tilt of the test head and keep probes parallel to the abject to be tested.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some probe apparatus according to the present invention used to check semiconductor chips on a wafer will be described with reference to the accompanying drawings.

Figure 1:
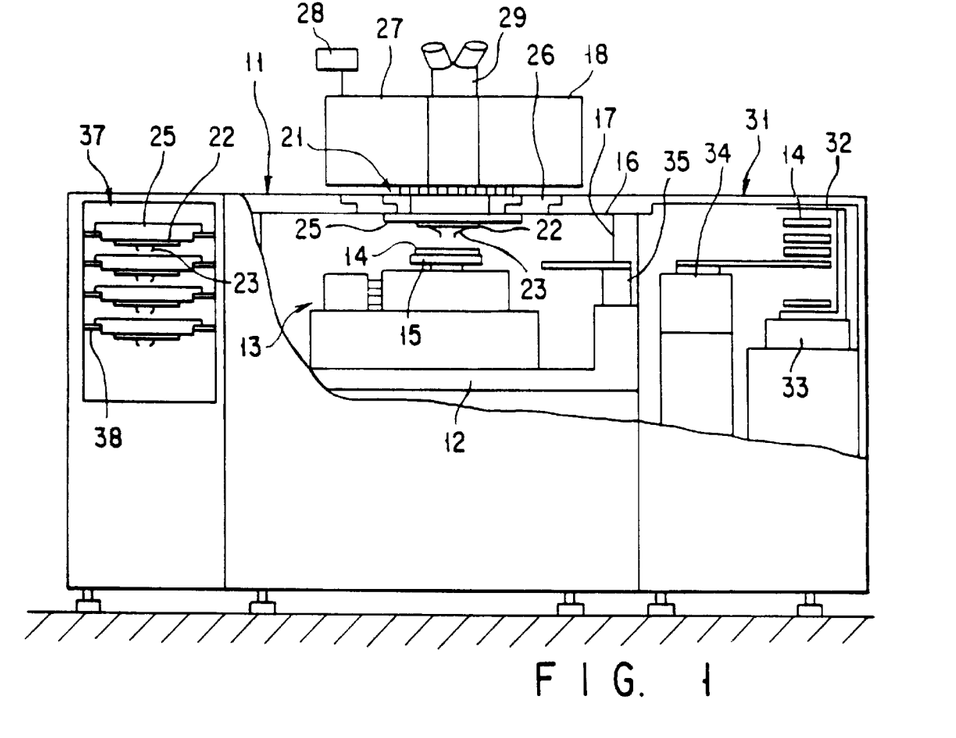
FIG. 1 shows he probe apparatus according to a first embodiment of the present invention, a part of which is cut away to show its inside arrangement.

As shown in FIG. 1, reference numeral 11 denotes a probe apparatus body shaped like a box and a main stage 13 as arranged on a support 12 in the center of the body 11. A table (or wafer chuck) 15 on which a semiconductor wafer 14 is mounted is arranged on the main stage 13. The wafer-mounted table 15 is mounted on an X-Y-θ table.

A head plate 17 is held horizontal on the top of the apparatus body 11 by a rigid support frame 16 which is erected on the support 12. An insert ring 18 is positioned in a center opening of the head plate 17 and a probe unit 21 is arranged in the insert ring 18. The probe unit 21 has a probe card 22 which is held by card holder 25. A plurality of probes 23 are attached to the probe card 22, which is previously set at a predetermined position by the holder 25. When the card holder 25 is supported by the insert ring 18, the probe unit 21 is set above and in opposite to the wafer-mounted table 15. A contact ring 26 is arranged on the probe unit 21 and electrically connected to the probe card 22.

A test head 27 is mounted and supported on the apparatus body 11 in which the probe unit 21 has been positioned as described above. It is electrically contacted with each probe 23 of the probe card 22 and with the contact ring 25. It is also electrically contacted with an external tester 28. A microscope or television camera 29 is arranged above it to view the wafer 14 and probe tips contacted with it through a center opening of the probe card 22. The test head 27 has a weight of about 300–400 kg, but the probe card 22 only a weight of about 500–800 g.

An autoloader 31 is arranged on one side of the apparatus body 11. A cassette mount 33 into and out of which a wafer cassette 32 is carried, holding a plurality of wafers 14 therein, is arranged, movable up and down, in the autoloader 31. A loader stage 34 is arranged adjacent to the autoloader 31 to pick up wafers 14 one by one out of the wafer cassette 32. An auxiliary alignment stage (not shown) is arranged adjacent to the loader stage 34 to add auxiliary alignment to the wafer 14.

A wafer handling arm 35 is arranged between the apparatus body 11 and the autoloader 31. It serves as a means for mounting the wafer 14, to which auxiliary alignment has been applied, on the wafer-mounted table (or wafer chuck) 15. This wafer handling arm 35 and the loader stage 34 also serve to pick up the wafer 14, which has been tested, from the wafer-mounted table 15 and return it Into the wafer cassette 32.

An alignment unit (not shown in FIG. 1) is arranged in the apparatus body 11 on the center front side thereof. It has an alignment system provided with a CCD camera 48 (FIG. 2) or a laser beam (not shown), and a detector circuit 36 provided with an electrostatic capacitance sensor 36a. The alignment system is intended to accurately align the wafer 14 on the wafer-mounted table 15, using scribe lines and others.

Figure 3:
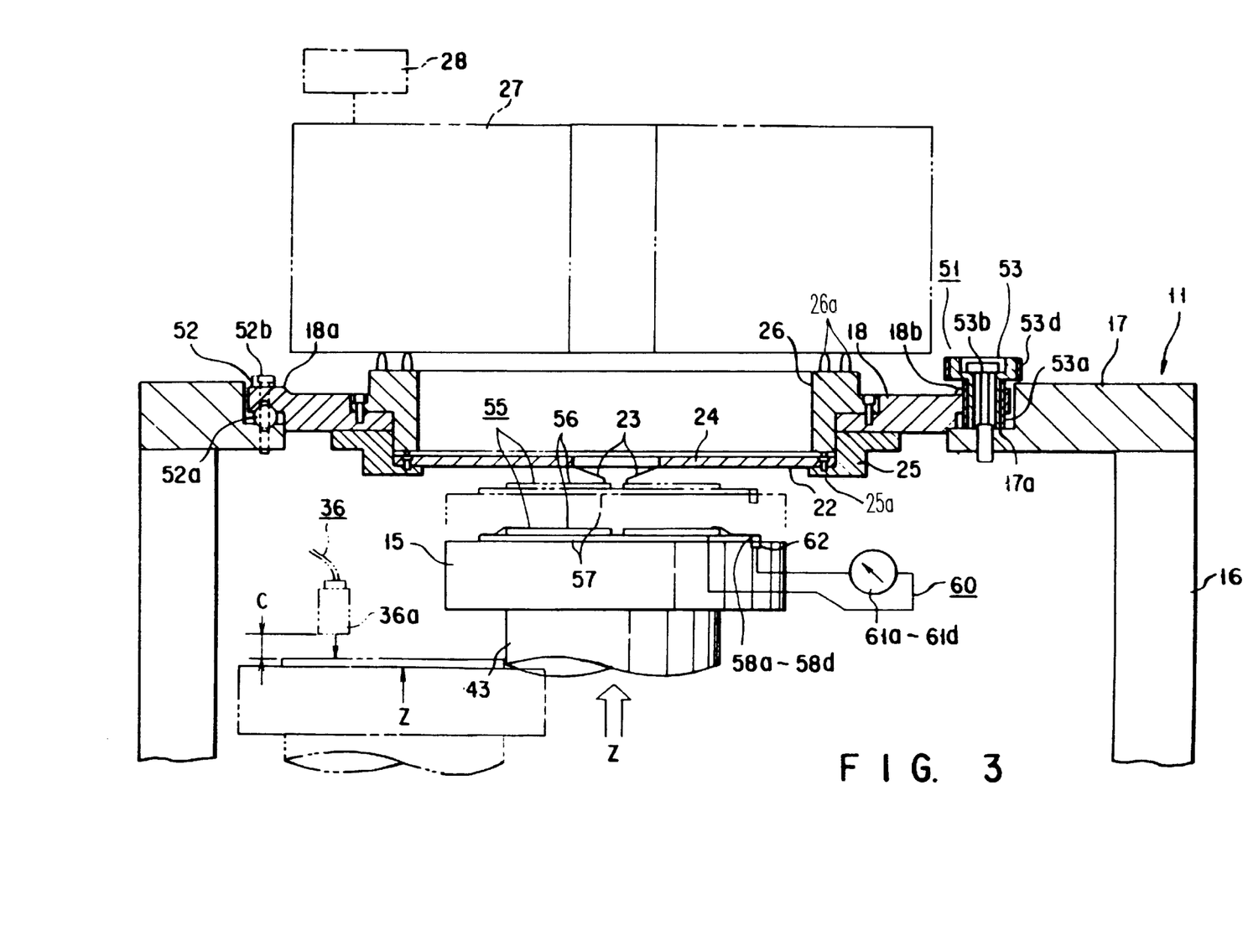
FIG. 3 is a vertically-sectioned view showing a main portion of the first probe apparatus.

As shown by virtual lines in FIG. 3, the wafer-mounted table 15 can be carried right under the electrostatic capacitance sensor 36a by a carrier system (not shown). The electrostatic capacitance sensor 36a serves to detect the position of the wafer-mounted table 15 in a direction Z and the thickness of the wafer 14 on it.

As shown in FIG. 1, a probe card exchanger 37 is arranged on the left side of the apparatus body 11. Card holding shelves 38 are provided in the probe card exchanger 37 and probe cards 22 of various kinds each having the card holder 25 can be stored, freely exchangable, on the shelves 38. If necessary, one of these probe cards 22 are taken out of the card holding shelves 38 and set in the insert ring 18 in the center the head plate 17. The setting and exchanging operation of the probe card 22 is manually made by the operator or automatically conducted by a unit (not shown) same as the wafer handling arm 16. This automatic probe card exchanger 37 is disclosed in U.S. Pat. No. 4,966,520.

Figure 2:
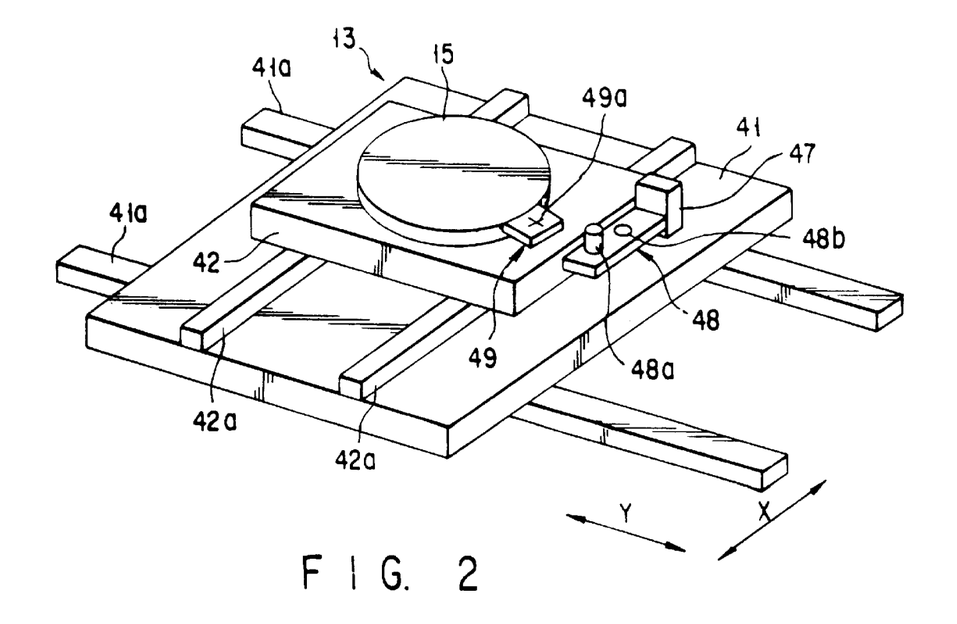
FIG. 2 is a perspective view showing a main stage provided with a wafer-mounted table, which is used in the probe apparatus.

As shown in FIG. 2, the main stage 13 includes a Y table 41 movable on two rails 41a extending in a direction Y and an X table 42 movable on two rails 42a extending on the Y table 41 in a direction X. Each of them is driven by a drive system (not shown) provided with a pulse motor. A rod 43 between the X table 42 and the wafer-mounted table 15 in connected to elevation and rotation drive systems (not shown) to drive the wafer-mounted table 15 in a direction Z and to rotate it in (about the axis Z).

As shown in FIG. 2, an elevation or lifter system 47 is attached to the side of the X table 42 of the main stage 13 and a camera 48 on it is moved up and down by the lifter system. The moving camera 48 comprises high and low magnification units 48a and 48b. On the other hand, a piece 49 is fixed to the side of the wafer-mounted table 15, protecting horizontal from it. Thin conductive film such as ITO (indium tin oxide) is formed on the top of the piece 49 or chrome plating is applied to it, and a target 49a such as a mark or cross is formed in the center of it.

The piece 49 is moved up and down and rotated together with the wafer-mounted table 15 and when it comes on the optical axis of the high magnification unit 48a of the moving camera 48, the center of its cross mark target 49a serves as a reference point to detect the position of the wafer-mounted table 15 in the direction θ (or round the axis Z) by the moving camera 48. Further, thin conductive film around the target 49a on the piece 49 allows the position (or height) of the wafer-mounted table 15 in the direction Z to be detected by the electrostatic capacitance sensor 36a. The position control by the alignment unit is disclosed in Jpn. Pat. Appln. KOKAI Publication No. Sho 64-73632.

A probe card assembly will be described in detail with reference to FIGS. 3 and 4.

A body 24 of the probe card 22 is a printed plate having a center opening. A plurality of probes 23 are tilted downward from both sides of the canter opening of the card body 24. Groups of these probes 23 are supported by the card body 24 to correspond to those of pads of single or plural chips. The card body 24 is seated on a step 25a of the card holder 25 and its outer circumference is positioned and fixed to the card holder 25 by pins and screws.

The probe card 22 can be detachably set at a position above and in opposite to the wafer-mounted table 15 when the card holder 25 is contacted with the underside of the insert ring 18 and fastened by fastening means or sandwiched by an automatic setting support ring movable up and down. The probe card in this case is of the tilted probe type but it may be of the VTPC type.

When the probe card 22 is set to the insert ring 18 in this manner, a plurality of electrodes in the card body (or printed plate) 24 are electrically connected to the contact ring 26 which is attached to the insert ring 18. As a result, each probe 23 is electrically connected to the test head 27 via the contact ring 26 and a pogo pin 26a (FIG. 3). When tips of the probes 23 are contacted with pads on the wafer, test signal is sent to a circuit and then to an input side of the tester 28.

The elevating (or Z-up) movement of the wafer-mounted table 15 at the time of probe test will be described.

The wafer-mounted table 15 is lifted from its lowermost reference position to a position adjacent to the underside of the probe card 22 at high speed. It is then lifted at low speed to a height (or contact point) where electrode pads on the chip are contacted with the probes 23. It is further lifted only by a bit of its stroke at a lower speed to over drive the contact point. It is preferable that the first distance lifted at high speed is set about 20 mm, that the next distance lifted at low speed is about 3–8 mm and that the final distance overdriven is about 50–100 $\mu$m to reliably attain full electric contact between the probes 23 and the pads.

The head plate 17 is supported horizontal on the support 12, on which the wafer-mounted table 15 is also supported, by the rigid support frame 16. The insert ring 18 is seated and fitted on a step 17a of the center hole of the head plate 17. The top of the wafer-mounted table 15, the head plate 17 and the insert ring 18 are arranged parallel to one another.

When the probe card 22 is practically set and positioned in the insert ring 18 and the heavy test head 27 is then mounted on them through the contact ring 26, however, the probe card 22 sometimes causes the level of probe tips of one probe group to be tilted relative to itself or to that of probe tips of other probe group. Means for detecting and correcting this tilting of the probe tip profile of the probe card 22 will be described with reference to FIGS. 3 and 4.

Figure 4:
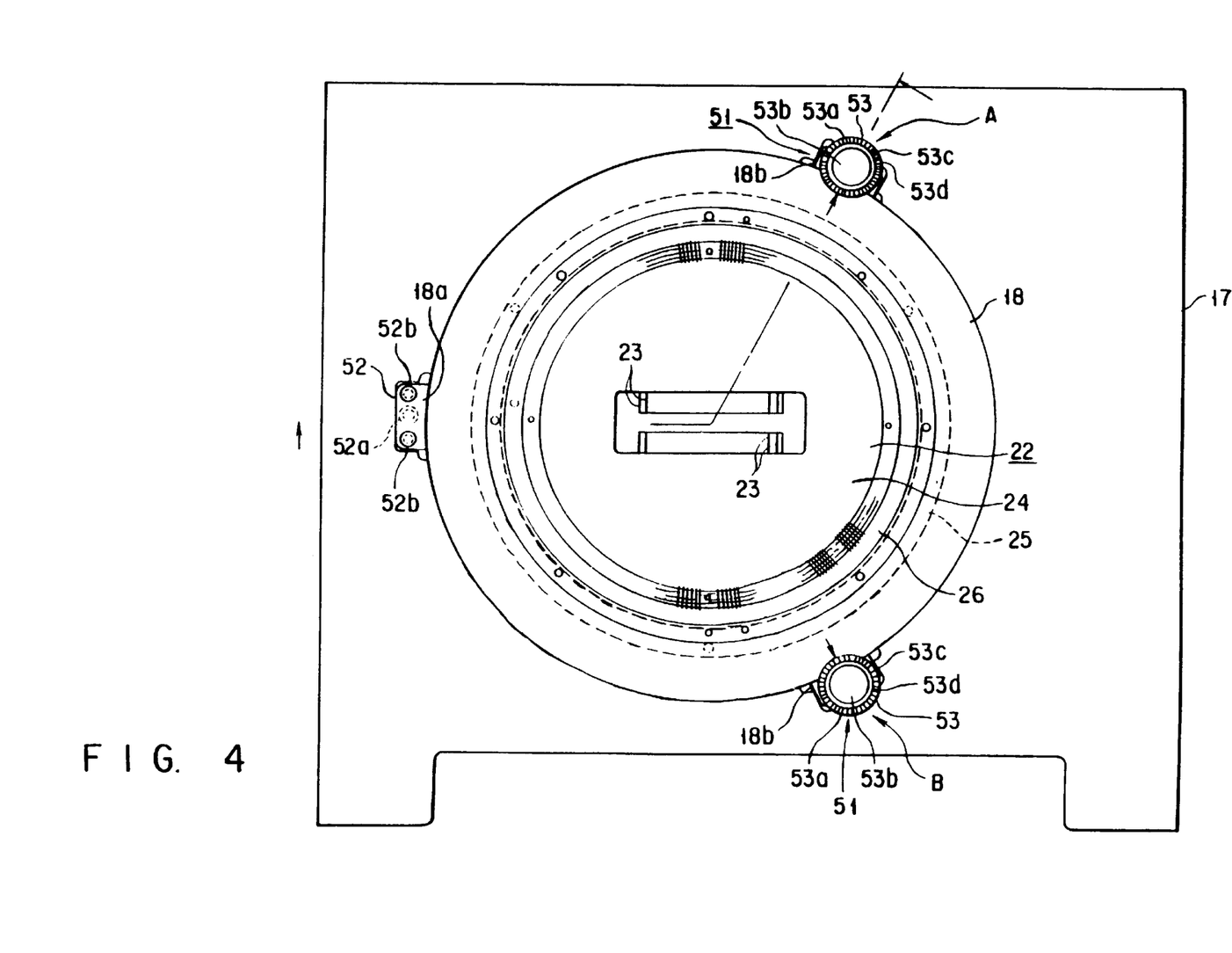
FIG. 4 is a plan view showing the main portion of the first probe apparatus.

As shown in FIG. 4, a tilt correcting unit 51 serves as means for detecting and correcting the tilting of the probe tip profile of the probe card 22. It has a ball hinge mechanism 52 and two adjustment screw mechanisms 53, through which the probe card assembly is supported on the head plate 17. One adjustment screw mechanism 53 is arranged at a fulcrum A while the other at a fulcrum B.

The ball hinge mechanism 52 includes a steel ball 52a and a pair of stopper screws 52b. The steel ball 52a as arranged between the step 17a of the head plate 17 and a protrusion 18a projected outward from the side of the insert ring 18. It is also positioned in the center between the paired stopper screws 52b.

As shown in FIG. 3, the outer rim portion of the insert ring 18 is put on the step 17a of the head plate 17 and fastened by screws 53b of the tilt correcting unit 51. In short, the tilt correcting unit 51 also serves as means for fastening the insert ring 18 to the head plate 17. To add more, the outer diameter of the insert ring 18 is about 2.5–3.5 times larger than that of the wafer 14.

Each adjustment screw mechanism 53 has a manual adjustment screw 53a and a stopper screw 53b. The manual adjustment screw 53a has on the head thereof a dial 53d provided with graduations 53c. A protrusion 18b projected outward from the side of the insert ring 18 can be adjusted to a desired support level while rotating the dial 53d forward or backward to set one of graduations 53c to a reference arrow. The stroke of each adjustment screw mechanism 53 is previously determined and the probe card 22 can be adjusted to a level of 1000 μm, maximum, in the direction Z by these adjustment screw mechanisms 53. Although the level of the probe card 22 is adjusted or changed in this case by manually adjusting the screws 53a, an automatic adjustment system may be employed using the distortion of a piezoelement.

A displacement sensor 55 having plural detection areas and a detection circuit 60 for detecting voltage changes caused when probes 23 are contacted with these detection areas of the displacement sensor 55 are provided as means for detecting the tip level of each probe group of the probe card 22 practically set. A control system 70 serves as means for confirming the probe tip profile of each probe group responsive to signal applied from the detector 60 and also on the basis of the distance over which the wafer-mounted table 15 is lifted, and arithmetically calculating the tilting degree and direction of the probe tip profile of each probe group to thereby provide correction commands.

Figure 5:
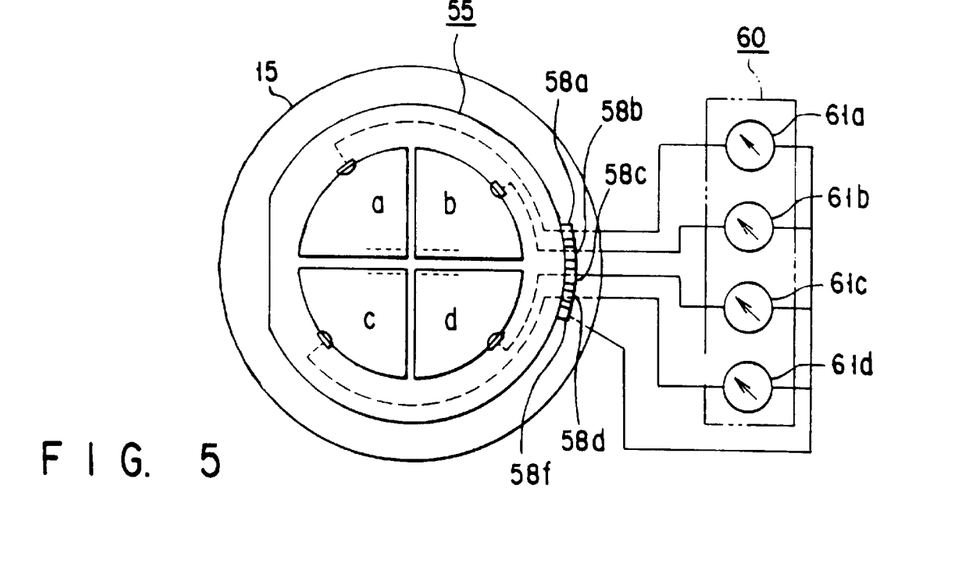
FIG. 5 is a circuit diagram showing probe tip level detector means of the first probe apparatus.
Figure 6:
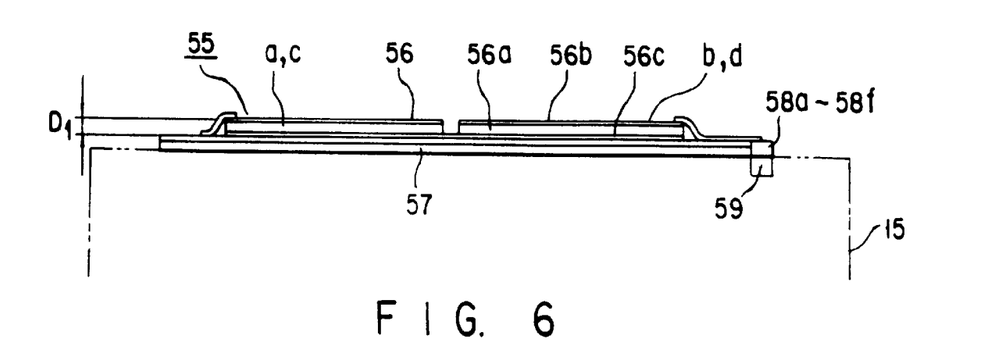
FIG. 6 is a side view showing a wafer-mounted table enlarged, said table having a displacement sensor of the contact type.

As shown in FIGS. 5 and 6, the displacement sensor of the contact type is made flat by a sensor body 56 and a plate 57. The sensor body 56 has three layers comprising PVDF (polyvinylidene fluoride) film 56a, 28 μm thick, and electrodes 56b and 56c formed on top and underside of film 56a. PVDF is a kind of piezoplastics.

PVDF film 56a generates voltage between both electrodes 56b and 56c due to electric polarization phenomenon (or piezoelectric effect) caused when mechanical distortion is applied to crystals of film 56a. Electrodes 56b and 56c are conductive foil films each being formed by evaporating aluminium all over the top or underside of film 56a.

Symbols a, b, c and d in FIG. 5 denote detection areas of the body 56 of the displacement sensor 55 contacted with probes 23. The displacement sensor 55 is equally divided into four detection areas to allow each of them to generate voltage due to piezoelectric effect. More specifically, the electrode 56c on the underside of film 56a is common to all of four detection areas and grounded, but PVDF film 56a on the electrode 56c and the electrode 56b on the top of film 56a are equally divided into four areas by cross-like grooves to make each area independent of the others.

The plate 57 of the displacement sensor 55 serves to support the resilient sensor body 56 flat and it is silicon wafer or made of glass, epoxy, plastics or others. When it is a conductive plate such as the silicon wafer, it is supposed to be used as the grounded underside electrode 56c for the sensor body 56, but insulation oxide film is applied to the top of it and the sensor body 56 is then fixed to them by adhesive in this case.

The plate 57 is same in outer diameter and thickness as the wafer 14 and it has an orientation flat. The extremely thin sensor body 56 is only bonded to it and the displacement sensor 55 of the contact type is therefore substantially same in shape as the wafer 14. This displacement sensor 55 is automatically transferred onto the wafer-mounted table 15, if needed. More specifically, it is housed and stored somewhere in the autoloader 31, carried out by the loader stage 34 and then pre-aligned. After then, it is mounted on the wafer-mounted table 15 by the wafer handling arm 35 and accurately positioned by the alignment unit.

The detector circuit 60 has four voltmeters 61a, 61b, 61c and 61d on the side of the wafer-mounted table 15 to detect voltage changes caused when detection areas a, b, c and d of the body 56 of the contact type displacement sensor 55 are contacted with probes 23.

The plate 57 of the contact type displacement sensor 55 is provided with contact terminals 58a, 58b, 58c and 58d, and an earth terminal 58f. The contact terminals 58a, 58b, 58c and 58d are connected to lead lines (or printed wires) extending from the top electrodes 56b of the detection areas a, b, c and d of the sensor body 56. The earth terminal 58f is connected to the underside electrode (or common ground) 56c. When the sensor 55 is mounted on the wafer-mounted table 15, electric contact of detection areas a, b, c and d with voltmeters 61a–61d can be automatically attained. To add more, the contact terminals 58a–58d and the earth terminal 58f are connected to a contact terminal 62 of the detector circuit 60 which is embedded in the top of the wafer-mounted table 15.

Figure 7:
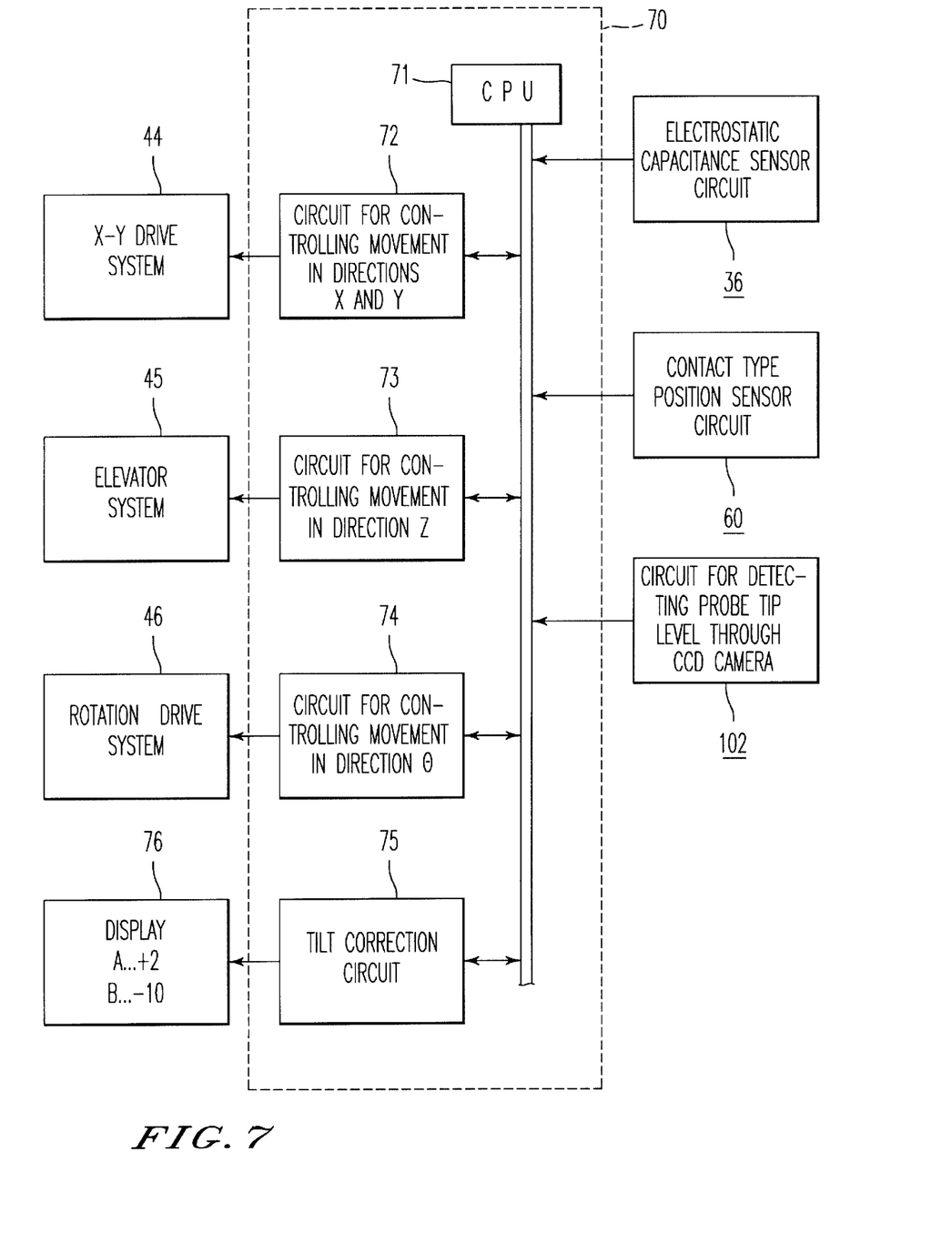
FIG. 7 is a block diagram showing a control system in the first probe apparatus.

Referring to FIG. 7, it will be described what relation the control system has to sensors and drive systems.

The control system 70 has a memory-provided CPU 71, to which circuits 72, 73 and 74 for controlling movement in the directions, X, Y, Z and θ are connected via a system bath. The control circuit 72 is connected to the X-Y drive system 44, the control circuit 73 to the elevation drive system 45 and the control circuit 74 to the rotation drive system 46.

The electrostatic capacitance sensor detecting circuit 36 of the alignment unit is also connected to the CPU 71 via the system bath. Further, the detector circuit 60 of the contact type displacement sensor 55 and a circuit 102 for detecting the probe tip level through a CCD camera are also connected to the CPU 71 through the system bath. The probe tip profile of each probe group can be checked on the basis of detection signals applied from these detector circuits 36 and 60 and the distance over which the wafer-mounted table 15 is lifted.

A tilt correction circuit 75 is connected to the CPU 71 through the system bath and a display 76 is connected to the tilt correction circuit 75. A predetermined soft programming is previously stored in the tilt correction circuit 75. The CPU 71 checks the probe tip profile of each probe group and arithmetically calculate the tilting degree and direction of the probe tip profile of the probe group on the basis of the result thus obtained to thereby show a command to correct the tilting of the probe tip profile on the display 76.

The command to correct the tilting of the probe tip profile is seen in the form of "A - - - +2 B - - - -10" on the display 76. When the operator sees this command on the display 76, he rotates the dial 53c of one adjustment screw mechanism 53 of the tilt correcting unit 51 which is located at the fulcrum A forward by two graduations and the dial 53c of the other adjustment screw mechanism 53 thereof which is located at the fulcrum B backward by ten graduations. The tilting of the probe tip profile of each probe group is thus corrected so that all of probes 23 can be more reliably contacted with the pads.

When the probe card 22 Is newly set in the insert ring 18 through the card holder 25 or exchanged with a new one, the displacement sensor 55 which has been housed and stored in the autoloader 31 is carried out at first by the loader stage 34. It is pre-aligned, mounted on the wafer-mounted table 15 and then further aligned, while viewing its image, by the alignment unit to more accurately position it on the table 15. The top level of the wafer-mounted table 15 and the level of the top electrodes 56b of the displacement sensor 55 on the table 15 are detected by the detector circuit 36 provided with the electrostatic capacitance sensor 36a. The thickness $D_1$ of the displacement sensor 55 is derived from the difference between these values thus obtained, and when stored in the memory of the CPU 71 of the control system 70.

The wafer-mounted table 15 is set at its lowermost center reference position by the X-Y drive system 44, lifted to a predetermined level at high speed by the elevation drive system 45 and then further lifted at low speed. When the wafer-mounted table 15 is lifted in this manner, top electrodes 56b at the detection areas a–d of the sensor body 56 on the table 15 come to contact tips of the probes 23.

At this instant when the tips of the probes 23 are contacted with the electrodes 56b, PVDF films 56a at the detection areas a–d of the sensor body 56 generate voltages between the upper electrodes 56b and the lower one 56c thanks to piezoelectric effect. These voltages thus generated are detected by the voltmeters 61a–61d of the detector circuit 60 and detection signals are applied to the CPU 71 of the control system 70.

Responsive to these detection signals applied from the detector circuit 60, the CPU 71 confirms the tip levels of probe groups of the probe card 22 and stores them in its memory. In short, the CPU 71 confirms distances $zh_1$ of the wafer-mounted table 15 from its lowermost reference position and stores them in the memory, said distances $ZH_1$ being confirmed at those instants when the detection areas a–d of the sensor 55 are contacted with tips of their corresponding probe groups.

The wafer-mounted table 15 is then lowered to its lowermost reference position. From results obtained by the CPU 71 while confirming the probe tip profiles, the tilt correcting circuit 75 arithmetically calculates the tilting degrees and directions of probe tip profiles and shows a correction command on the display 76.

When all of the detection areas a–d of the displacement sensor 55 are contacted with probe tips of their corresponding probe groups at the same time, detection signals are applied to the CPU 71 at the same time, too. "A - - - ±0 B - - - ±0" is therefore displayed on the display 76 and no tilt correction is needed in this case.

When the detection areas a–d of the displacement sensor 55 are contacted with probe tips of their corresponding probe groups at different timings, those instances when detection signals are applied to the CPU 71 become different. In short, some detection signals are applied faster to the CPU 71 but others are slower. The CPU 71 arithmetically calculates the tilting degrees and directions of tip levels of probe groups in this case and causes the display 76 to display table support levels at fulcrums A and B like "A - - - +2 B - - - -10", for example. When seeing this, the operator rotates dials 53c at the fulcrums A and B, respectively. The tilting of probe tip profile of probe groups is thus corrected to thereby enable all of the probes 23 to be reliably contacted with the pads.

When the tilting of probe tip profile is corrected in this manner, the displacement sensor 55 of the contact type is picked up from the wafer-mounted table 15, which has been lowered to its lowermost reference position, by the wafer handling arm 35 and returned to its original position in the autoloader 31 by the loader stage 34. A first wafer 14 which is to be practically tested as carried out of the wafer cassette in the autoloader 31, pre-aligned and then mounted on the wafer-mounted table 15 by the wafer handling arm 35. It is further aligned through an image confirming system in the alignment unit and thus accurately positioned and held on the table 15, which is then returned to its lowermost reference position. Before and after this process, top levels of the wafer-mounted table 15 and the wafer 14 on the table 15 are detected in the alignment unit.

The CPU 71 calculates a thickness $D_2$ of the wafer 14 from the difference of values thus obtained, and then a difference $\pm\Delta(D_1-D_2)$ between thicknesses $D_1$ and $D_2$ of the displacement sensor 55 and the wafer 14. Further, this difference $\pm\Delta$ is added to the level $ZH_1$ of the wafer-mounted table 15 previously obtained at the time when the top of the contact type displacement sensor 55 were contacted with tips of probes 23 to thereby calculate a contact level $ZH_2$ $(=ZH_1+(\pm\Delta))$ at which the wafer 14 lifted is practically contacted with tips of probes 23. This contact level $ZH_2$ denotes the contact point of the wafer 14 relative to probes of the probe card 22 practically set. The distance over which the wafer-mounted table 15 is lifted from its lowermost reference position is set equal to the contact point $ZH_2$. In the practical case, however, the wafer-mounted table 15 lifted is set in the Z direction movement control circuit 73 as the over-driven distance added to about 50–100 μm from contact point.

When the wafer-mounted table 15 is lifted in this manner, electrode pads on semiconductor chips of the wafer 14 can be more reliably contacted with probe tips of their corresponding chip groups and electric property of each semiconductor chip can be thus more accurately checked, while preventing the wafer from being incorrectly contacted with probe tips or struck against them to become broken. When test to the first wafer 14 as finished, the wafer 14 is returned into the wafer cassette 32 in the autoloader 31 and same process will be applied to each of wafers 14 followed.

When the thickness of the contact type displacement sensor 55 is made same as that of the wafer 14, the contact point can be obtained without conducting any thickness detection through the electrostatic capacitance sensor 36.

Although the contact type displacement sensor 55 has four detection areas a–d in the above-described case, it may have three or more than five detection areas.

Although the contact type displacement sensor 55 is made in the above case as an attachment detachably mounted on the wafer-mounted table 15 only when needed, it may be made as a member held on the table 15 at all times.

Although the tilting of the insert ring 18 is directly corrected (while that of the probe card 22 as indirectly corrected) in the above case, the head plate 17, instead, may be directly corrected. When it is made so, the space which is occupied by the ball hinge and support level adjustment screw mechanisms 52 and 53 can be made fully larger and design freedom for these mechanisms can be made by far wider.

Each support level adjustment screw mechanism 53 may use a ball screw having an autodrive motor instead of the manual adjustment screw system provided with the graduated dial. The autodrive motor is electrically connected to the tilt correction circuit 75 of the control system 70 in this case. Responsive to correction command signal applied from the tilt correction circuit 75, therefore, the motor is rotated forward and backward to change the support level of the insert ring 18 or head plate 17 through the ball screw. The tilting of probe tips can be thus automatically corrected.

A contact-check-programmed tester capable of confirming whether or not probes are contacted with a conductive dummy plate may be used as probe tip profile detector dummy. Probe tip profile of plural probe groups are detected in this case responsive to signal applied from the tester and also on the basis of the distance over which the table 15 is lifted from its lowermost reference position.

A CCD camera through which irregular probe tip levels of plural probe groups of the probe card 22 practically set are confirmed, and a detector circuit for detecting probe tip profile of them from the focus depth of this camera may be used as probe tip profile detector means.

Figure 8:
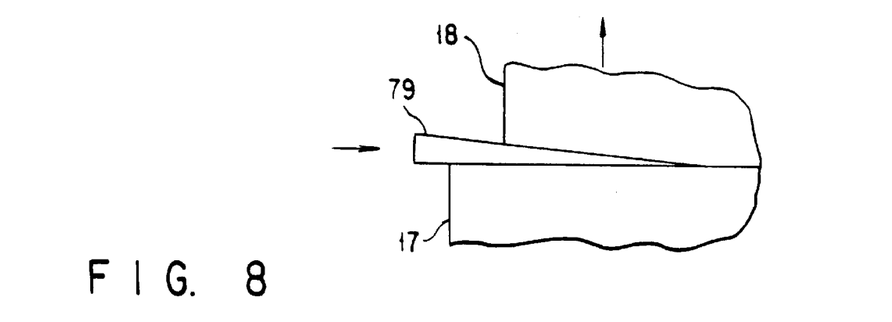
FIG. 8 is a sectional view showing a probe tip level correction unit.

As shown in FIG. 8, a wedge member 79 arranged between the head plate 17 and the insert ring 18 may be pushed or retracted to correct the tilting of the probe card 22 as well as that of the insert ring 18.

Figure 9:
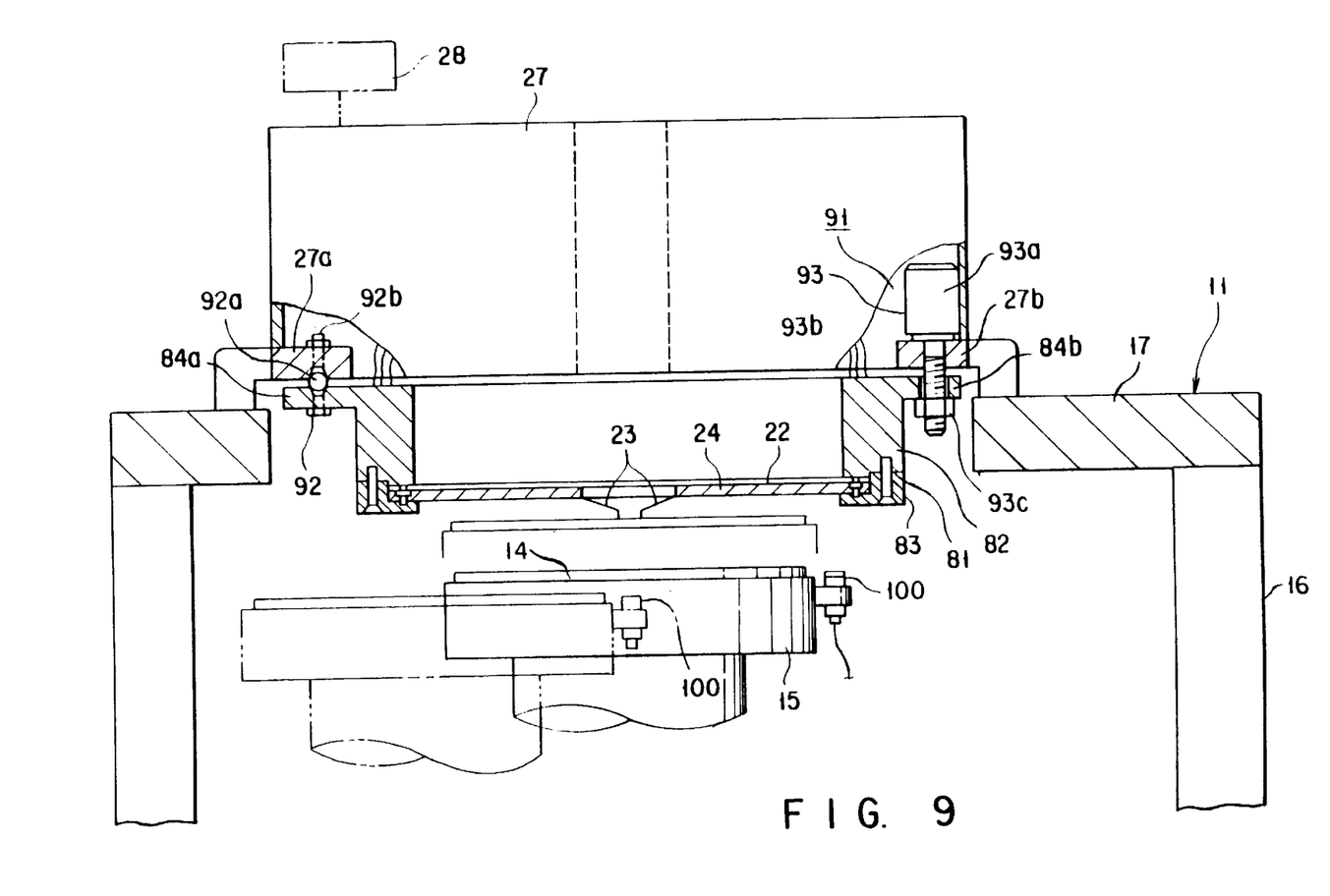
FIG. 9 is a vertically-sectioned view showing a main portion of the probe apparatus according to a second embodiment of the present invention.
Figure 10:
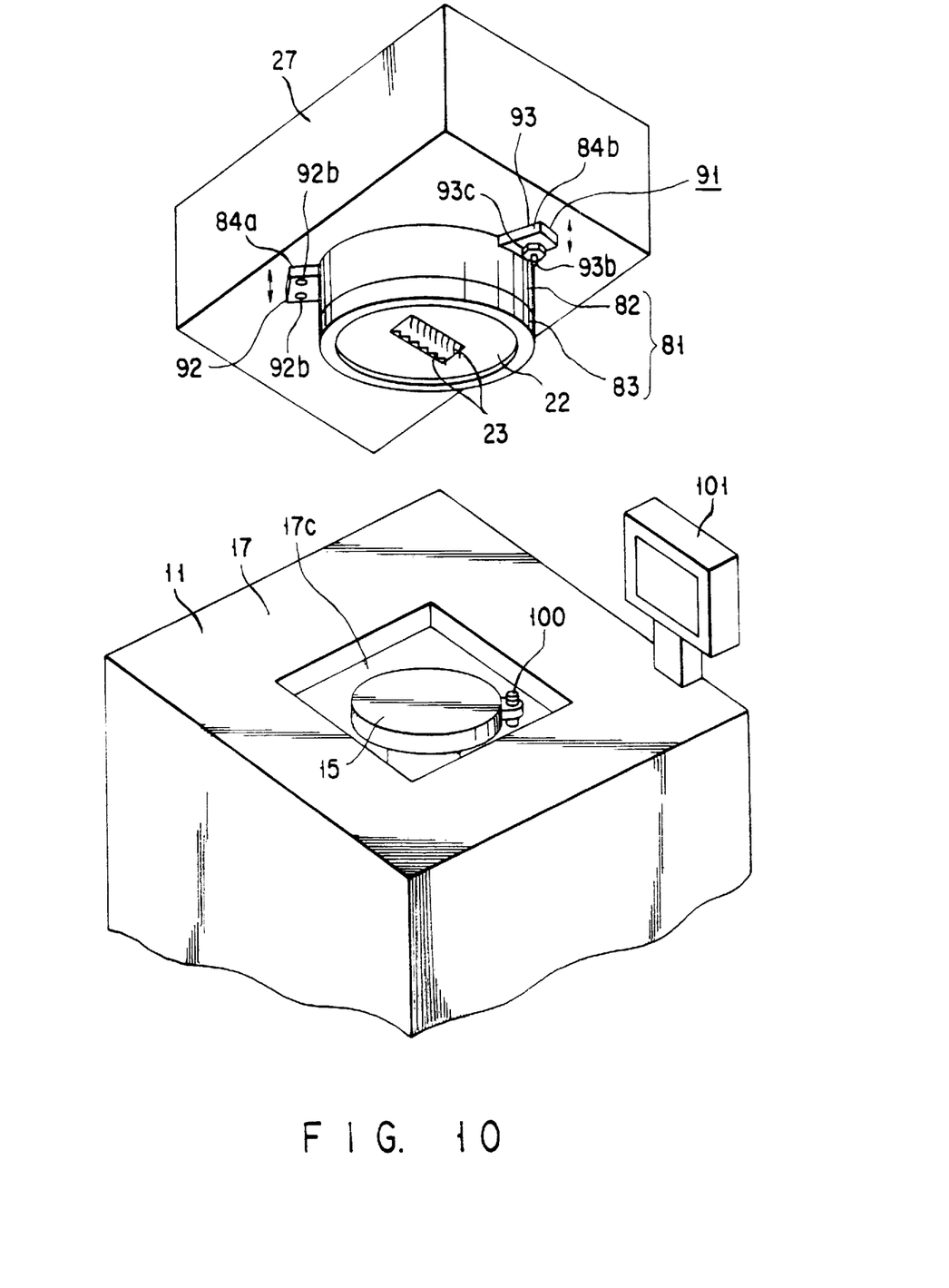
FIG. 10 is a perspective view showing the second probe apparatus dismantled.

A second embodiment of the present invention will be described with reference to FIGS. 9 and 10. Same components as those of the first embodiment will be described only when needed.

In the second probe apparatus, the probe card 22 is positioned and supported under the test head 27, which is arranged rotatable and erectable on the top on the apparatus body 11, through a card holder 81.

In the second probe apparatus, the card holder 81 is supported on the center underside of the test head 27 at three points thereof by a tilt correction unit 91. When the tilt correction unit 91 is adjusted responsive to support level correction commands, the tilting of the probe tip profile of each probe group of the probe card 22 can be corrected. The card holder 81 includes a cylindrical holder body 82 which also serves as the contact ring, and a ring-shaped holder member 83 for holding the probe card 22 under the holder body 82 by positioning pins and fasteners. Three protrusions 84a, 84b and 84c are projected radially and outwards from the top rim of the holder body 82.

The tilt correction unit 91 hangs the card holder 81 from the bottom of the test head 27 through three protrusions 84a–84c. A ball hinge mechanism 92 is arranged at one of three hanging points and support level adjustment screw mechanisms 93 at other two handing points. The ball hinge mechanism 92 is substantially same as the one used in the first probe apparatus.

Each support level adjustment screw mechanism 93 is of the motor autodrive type. It includes a motor 93a, a ball screw 93b and a screw feeding nut 93c. The motor 93a is fixed to a frame 27b in the test head 27. The ball screw 93b is passed through the protrusion 84b to serve as a vertical rod or axis and it is rotated forward and backward by the motor 93a. The screw feeding nut 93c is fixed to the underside of the protrusion 84b and screwed onto the ball screw 93b.

A CCD camera 100 and a detector circuit 102 are provided as means for detecting the probe tip profile of each probe group. The CCD camera 100 is attached to the side of the wafer-mounted table 15 in the apparatus body 11 to check probe tip profiles of plural probe groups of the probe card 22. The detector circuit 102 is intended to detect probe tip profile of plural probe groups on the basis of focus depths of CCD camera 100.

The probe tip profile detecting operation conducted by the second probe apparatus will be described.

The CCD camera 100 is moved right under the probe card 22, while controlling the movement of the wafer-mounted table 15, and probe tips of some of probe groups are enlarged and checked through the camera 100. Probe tip profiles of these probe groups are detected on the basis of those focus depths of the camera, which are obtained when the probe tips of them are checked through the camera, by the detector circuit. Detection signals thus obtained are applied to the tilt correction circuit 75 to arithmetically calculate the tilting degrees and directions of probe tip profiles of them. The results are displayed on a display 101.

Responsive to correction command signals, the motor 93a of each support level adjustment screw mechanism 93 of the tilt correction unit 91 is driven to rotate the ball screw 93b forward and backward. When the level of the card holder 81 is changed at two points of the holder 81 in this manner, the card holder 81 is tilted, taking the ball hinge mechanism 92 as a fulcrum, to thereby automatically correct the tilting of the probe tip profile of each probe group.

A third embodiment of the present invention will be described, referring to FIGS. 11 through 13. Same components as those of the first and second embodiments wall be described only when needed.

Figure 11:
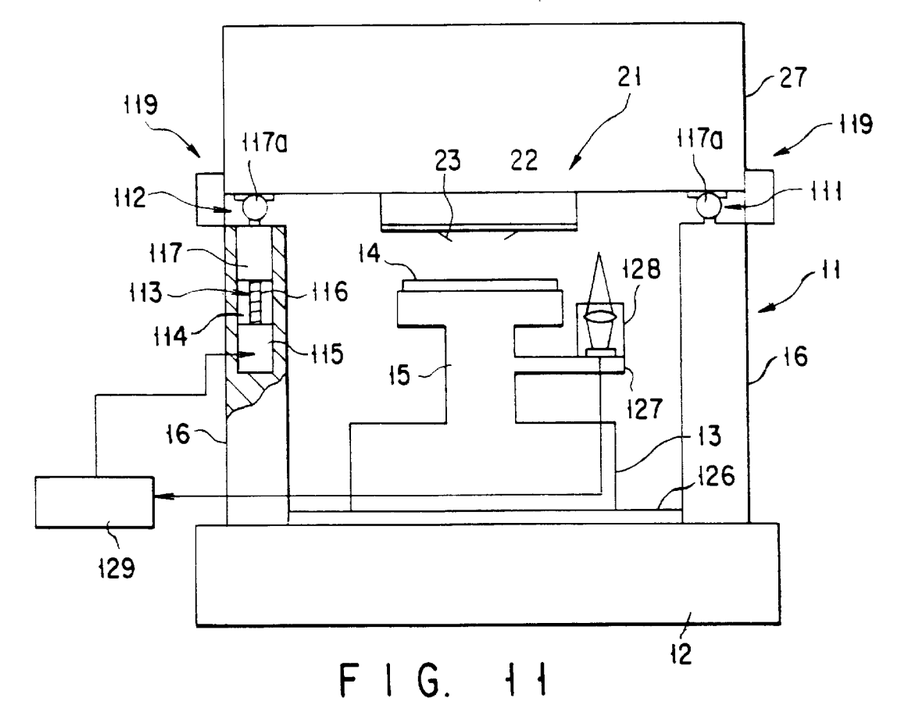
FIG. 11 is a perspective view showing a third probe apparatus partly cut away.
Figure 12:
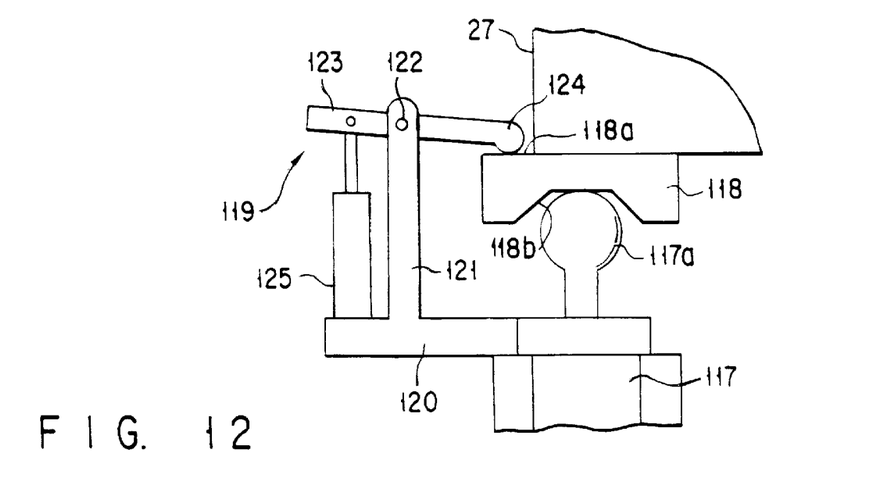
FIG. 12 is a sectional view showing a clamp mechanism of the third probe apparatus enlarged.

As shown in FIGS. 11 and 12, support frames 16 are erected on the support 12 of the probe apparatus body 11 and support sections 111 and 112 are provided in the support frames 16 to support the test head 27. One of them is a fixed one 111 and the other remaining three are movable ones 112. Each movable section 112 includes a test head adjustment mechanism 113 for moving up and down, taking the fixed support section 111 as a reference point, to adjust the tilting of the test head 27.

A motor 115 of the mechanism 113 is arranged in a hollow 114 of the support frame 16. The drive shaft of the motor 115 is connected to a screw rod 116, which is screwed into a slider 117.

The shape of the slider 117 is rectangular in section, the slider 117 is not rotatable relative to the support frame 16 but slidable in it in its longitudinal direction. When screw rod 116 is rotated, the slider 117 is moved up and down.

As shown in FIG. 12, a ball-like support 117a is formed on the top of the slider 117 and it is same in shape as the one at the fixed support section 111.

A support seat 118 is attached to the underside of the test head 27. A recess 118b is formed in the underside of the support seat 118 and it receives the ball-like support 117a. In short, the test head 27 is supported at four corners or points thereof by the ball-like supports 117a.

Each of the support sections 111 and 112 is provided with a clamp mechanism 119 for connecting the test head 27 to the support frame 16. Each clamp mechanism 119 includes a base 120 fixed to the support 117a, a rod 121 erected on the base 120, a pivot pin 122 arranged in the upper end of the rod 121, and a swing lever 123 swingable round the pivot pin 122. The swing lever 123 has at the front end thereof a contact 124 contactable with a shoulder 118a of the support seat 118 fixed to the test head 27 and it is connected to an air cylinder 125 at the base end thereof. When the base end of the swing lever 123 is pushed up by the air cylinder 125, the contact 124 thereof is contacted with the shoulder 118a of the support seat 118 to push the test head 27 against the support frame 16 through the support seat 118. The test head 27 can be thus fixed to the support frame 16.

The main stage 13 having the wafer-mounted table 15 is supported, movable horizontally along a stage guide 126, by the base 12. The stage guide 126 serves as a horizontal reference plane for the wafer-mounted table 15.

A camera fixing arm 127 is horizontally and outwards projected from the wafer-mounted table 15 and an optical system or a television camera 128 is mounted, as means for checking the parallel of probes, on the camera fixing arm 127. The television camera 128 is moved together with the wafer-mounted table 15, while opposing to the probe card 22. It is intended to optically measure the tilting of the probe card 22 or probes 23 relative to the stage guide 126 which serves as the horizontal reference plane.

The television camera 128 is electrically connected to a control circuit 129, which serves as control means, and detection signal relating to the parallel of probes 23 to the horizontal reference plane or stage guide 126 is applied to the test head adjustment mechanism 113 through the control circuit 129. The adjustment mechanism 113 can be thus controlled.

The operation of the third probe apparatus will be described below.

The test head 27 is supported by the fixed and movable support sections 111 and 112. The base end of each swing lever 123 is pushed up by the air cylinder 125 of each clamp mechanism 119. The contact 124 of the swing lever 123 is thus contacted with the shoulder 118a of the support seat 118 to force the test head 27 against each support frame 16 through the support seat 118. The test head 27 can be thus fixed to the support frames 16.

The tilting of the probe tap profile of each probe group is optically measured by the television camera 128 while moving the wafer-mounted table 15 in directions X and Y.

Figure 13:
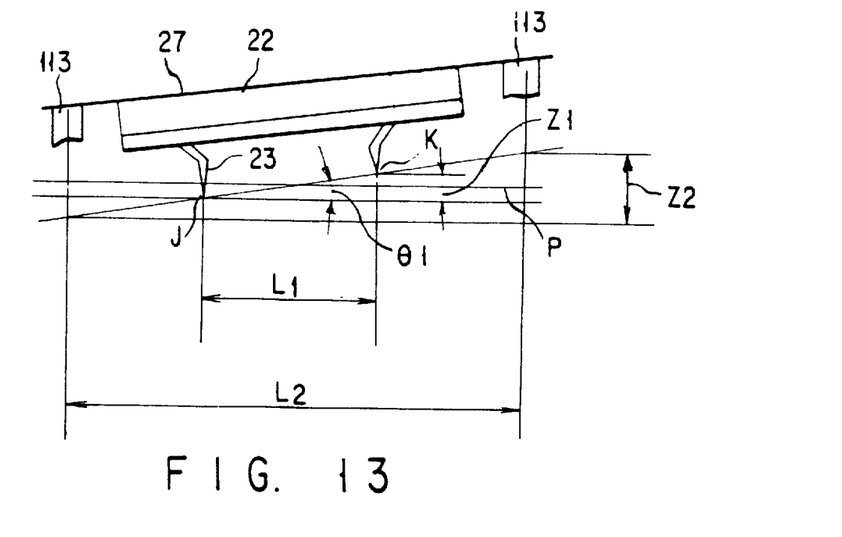
FIG. 13 is a schematic illustration showing a probe apparatus according to a third embodiment.

When probes 23 of the probe card 22 are tilted relative to a reference line P as shown in FIG. 13 the control circuit 129 measures the level at the lowermost point J and that at the highest point K to obtain a difference $Z_1$ between them. At the same time, distance $L_1$ from the point a to the point K is also calculated. Distance $L_2$ between two test head adjustment mechanisms 113 which support the test head 27 is certain. From distances $L_1$, $L_2$ and difference Z, therefore, tilting distance $Z_2$ and angle $\theta_1$ are calculated.

Responsive to control signal applied on the basis of results calculated by the control circuit 129, each adjustment mechanism 113 is made operative. In short, motors 115 on the side of the point a are rotated forward and those 115 on the side of the point K backward. Sliders 117 on the side of the point J are thus lifted and those on the side of the point K lowered. The tilting of the test head 27 can be thus corrected to keep the probe tip level of each probe group parallel to the stage guide 126.

While using that portion of the test head, which is supported by the fixed support section 111, as the horizontal reference plane instead of the stage guide 126, only the adjustment mechanisms 113 of the movable support sections 112 may be moved up and down.

The test head 27 may be adjusted parallel while keeping the clamp mechanisms 119 released and then clamped by them.

Figure 14:
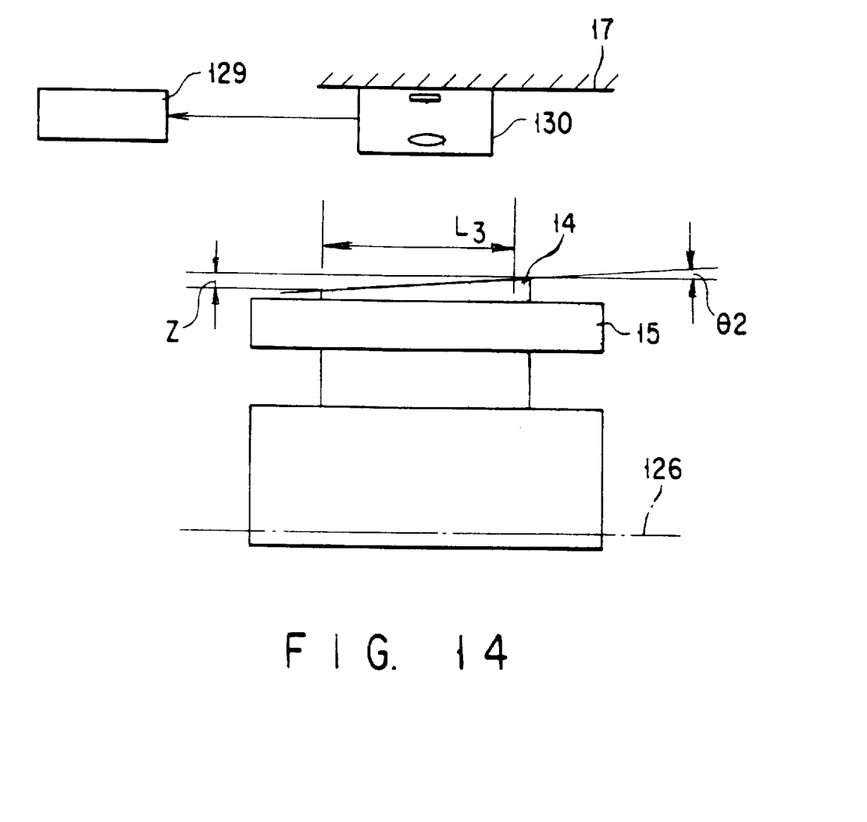
FIG. 14 is a schematic illustration showing a probe apparatus according to a fourth embodiment.

A fourth embodiment of the present invention will be described with reference to FIG. 14. Same components as those of the above-described embodiments will be described only when needed.

A television camera 130 is attached to the heat plate 17 which serves as a horizontal reference plane for the probe apparatus body 11. It is opposed to the wafer-mounted table 15 to measure the parallel of the wafer 14 on the wafer-mounted table 15. When the wafer 14 is carved, it tilts relative to the top of the wafer-mounted table 15. This tilting of it is measured and the tilting of probes 23 of the probe card 22 is corrected through the test head 27 on the basis of results thus measured.

The television camera 130 is electrically connected to a control circuit 129 which serves as control means. The control circuit 129 can control the adjustment mechanisms 113 in such a way that parallel detection signals of probes 23 and the wafer 14 relative to the state guide 126, which serves as the horizontal reference plane, are applied from the control circuit 129 to the adjustment mechanisms 113.

The wafer-mounted table 15 is moved in directions X and Y, while holding the wafer 14 on it, and the parallel of the wafer 14 is measured at three points thereof by the television camera 130. $\theta_2 x$ and $\theta_2 y$ (which are the X-axis and Y-axis components of $\theta_2$ of FIG. 14) are calculated from values z thus obtained and applied to the control circuit 129 as parallel detection signal of the wafer 14.

On the other hand, the probe lip level of each probe group is measured through the television camera 130 and values thus obtained are applied, as parallel detection signal of the probes 23, to the control circuit 129.

Responsive to tiltings $\theta_1$ and $\theta_2$ of probes 23 and wafer 14 applied, the control circuit 129 calculates "$\theta_1 - \theta_2$" and a result thus calculated is applied, as control signal, to each adjustment mechanism 113 to make it operative.

According to the above-described embodiment, the tilting of probes 23 can be corrected while moving the test head 27 up and down on the basis of both data relating to tiltings of the wafer 14 and probes 23 of the probe card 22. The electric property of each semiconductor chip can be thus more accurately checked.

According to the probe apparatus of the present invention, the probe tip profile tilting of each probe group which is caused by making and attaching errors and deformation of the probe card can be detected and corrected by far more easily and reliably while keeping the probe card pratically set. The setting of the probe card assembly can be thus made by far easier and the contact accuracy of probes relative to the electrode pads can be enhanced to make test accuracy higher.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus comprising:

a table on which an object to be tested is mounted, said object having a circuit connected to a plurality of pads;

a probe card assembly having a card body and groups of probes held by a card holder;

lifter means for lifting the table to cause tips of probes to be contacted with pads of the object;

a test head for sending at least one test signal to the circuit of the object through probes and pads, which are contacted with one another, to test the electric property of the circuit;

test head adjustment mechanisms for supporting the test head and adjusting the tilt of the probe card assembly with the test head, said test head adjustment mechanisms including a pair of level adjustment screw mechanisms and a ball hinge mechanism, and wherein said level adjustment screw mechanisms provide up and down adjustments to adjust the tilt about the ball hinge mechanism;

probe measuring means for measuring the parallel of a probe tip profile of probe groups to a top surface of the table;

object measuring means arranged opposite to the table to measure the parallel of a pad top profile of the object on the table relative to the probe tip profile of probe groups; and control means for controlling the test head adjustment mechanisms to adjust a tilt of the test head, responsive to detection signals applied from the probes and object measuring means, so that the probe tip profile can be kept parallel to said pad top profile.

2. The probe apparatus according to claim 1, wherein the probe measuring means includes a camera for taking an image of probe tips at plural sections and a detector circuit for detecting levels of probe tips from focus depths of the camera at plural sections.

3. The probe apparatus according to claim 1, wherein at least one of the card holder, an insert ring and a head plate is supported at at least three support points, and wherein said pair of level adjustment screw mechanisms are arranged at two of said three support points to support at least one of the card holder, insert ring and head plate for up and down movement, and wherein said ball hinge mechanism is arranged at a third of said three support points.

4. The probe apparatus according to claim 3, wherein the stroke of at least one of the card holder, insert ring and head plate moved by the level adjustment screw mechanisms is not greater than 1000 $\mu$m.

5. The probe apparatus according to claim 3, wherein each of said level adjustment screw mechanisms has a ball screw provided with an autodrive motor.

6. The probe apparatus according to claim 1, wherein each of said level adjustment screw mechanisms includes a motor arranged in an apparatus body, a screw rod rotated by the motor, and a slider screwed onto the screw rod and moved up and down as the screw rod is rotated while supporting the test head.

* * * * *

UNITED STATES PATENT AND TRADEMARK OFFICE
CERTIFICATE OF CORRECTION

PATENT NO. : 5,804,983
DATED : September 8, 1998
INVENTOR(S) : Hisashi Nakajima, et. al.

It is certified that error appears in the above-identified patent and that said Letters Patent is hereby corrected as shown below:

Title page, item [73], Assignee: should read --Tokyo Electron Limited, Tokyo, Japan--

Signed and Sealed this

Twenty-second Day of August, 2000

Q. TODD DICKINSON

*Attest:*

*Attesting Officer*  *Director of Patents and Trademarks*